United States Patent
Haraguchi (10) Patent No.: US 10,903,386 B2
(45) Date of Patent: Jan. 26, 2021

(54) SOLID-STATE IMAGE SENSOR, IMAGE CAPTURING APPARATUS, AND IMAGE CAPTURING METHOD

(71) Applicant: CANON KABUSHIKI KAISHA, Tokyo (JP)

(72) Inventor: Kazuki Haraguchi, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 28 days.

(21) Appl. No.: 16/218,782

(22) Filed: Dec. 13, 2018

(65) Prior Publication Data

US 2019/0189827 A1 Jun. 20, 2019

(30) Foreign Application Priority Data

Dec. 20, 2017 (JP) .................................. 2017-244141
Sep. 20, 2018 (JP) .................................. 2018-176149

(51) Int. Cl.
| H01L 31/107 | (2006.01) |
| H01L 27/146 | (2006.01) |
| H04N 5/376 | (2011.01) |
| H04N 5/369 | (2011.01) |
| H04N 5/3745 | (2011.01) |
| H04N 5/367 | (2011.01) |

(52) U.S. Cl.
CPC .... *H01L 31/1075* (2013.01); *H01L 27/14612* (2013.01); *H01L 27/14643* (2013.01); *H04N 5/367* (2013.01); *H04N 5/3698* (2013.01); *H04N 5/3745* (2013.01); *H04N 5/3765* (2013.01)

(58) Field of Classification Search
None
See application file for complete search history.

(56) References Cited

U.S. PATENT DOCUMENTS

| 9,431,439 B2 | 8/2016 | Soga et al. |
| 2002/0024058 A1 | 2/2002 | Marshall et al. |
| 2008/0240341 A1 | 10/2008 | Possin et al. |
| 2013/0299673 A1 | 11/2013 | Williams et al. |
| 2014/0231630 A1 | 8/2014 | Rae et al. |
| 2017/0131143 A1* | 5/2017 | Andreou .................. G01J 1/44 |

FOREIGN PATENT DOCUMENTS

| JP | 2014-081253 A | 5/2014 |
| JP | 2017-167125 A | 9/2017 |

OTHER PUBLICATIONS

Search Report dated Mar. 27, 2019, in European Patent Application No. 18211223.5.

* cited by examiner

*Primary Examiner* — James M Hannett
(74) *Attorney, Agent, or Firm* — Venable LLP (57) ABSTRACT

A solid-state image sensor comprising one or more processors and/or circuitry which functions as: a pixel portion in which a plurality of pixels are arranged, each pixel being provided with a sensor that includes an avalanche photodiode and a quenching resistor; and a controller that performs setting so that a bias voltage smaller than a breakdown voltage of the avalanche photodiodes is applied across the avalanche photodiode provided in an abnormal pixel among the plurality of pixels.

16 Claims, 6 Drawing Sheets

SOLID-STATE IMAGE SENSOR, IMAGE CAPTURING APPARATUS, AND IMAGE CAPTURING METHOD

BACKGROUND OF THE INVENTION

Field of the Invention

The present invention relates to a solid-state image sensor, an image capturing apparatus, and an image capturing method.

Description of the Related Art

Conventionally, technology with which a single photon is detected by using an avalanche photodiode (APD) has been proposed. When a photon is incident on an avalanche photodiode across which a reverse bias voltage greater than a breakdown voltage is applied, a carrier is generated, avalanche multiplication occurs, and a large electric current flows. It is possible to detect a photon based on this current. Such an avalanche photodiode (APD) is called a SPAD (Single Photon Avalanche Diode). Japanese Patent Laid-Open No. 2014-81253 discloses a photo detector having an avalanche photodiode in a light receiving element.

If there is a crystal defect in an avalanche photodiode, the crystal defect creates a dark current, and an avalanche multiplication phenomenon may occur in that avalanche photodiode even if a photon is not incident on the avalanche photodiode. If an avalanche multiplication phenomenon occurs even if a photon is not incident, power consumption increases.

SUMMARY OF THE INVENTION

The present invention has been made in consideration of the above situation, and provides a solid-state image sensor, an image capturing apparatus, and an image capturing method that can reduce power consumption.

According to the present invention, provided is a solid-state image sensor comprising one or more processors and/or circuitry which functions as: a pixel portion in which a plurality of pixels are arranged, each pixel being provided with a sensor that includes an avalanche photodiode and a quenching resistor; and a controller that performs setting so that a bias voltage smaller than a breakdown voltage of the avalanche photodiodes is applied across the avalanche photodiode provided in an abnormal pixel among the plurality of pixels.

Further, according to the present invention, provided is an image capturing apparatus comprising the solid-state image sensor that comprises one or more processors and/or circuitry which functions as: a pixel portion in which a plurality of pixels are arranged, each pixel being provided with a sensor that includes an avalanche photodiode and a quenching resistor; and a controller that performs setting so that a bias voltage smaller than a breakdown voltage of the avalanche photodiodes is applied across the avalanche photodiode provided in an abnormal pixel among the plurality of pixels, and a processor that performing predetermined signal processes on signals output by the solid-state image sensor.

Furthermore, according to the present invention, provided is a method of capturing an image, comprising: setting so that, in a plurality of pixels each provided with a sensor that includes an avalanche photodiode and a quenching resistor, a bias voltage smaller than a breakdown voltage of the avalanche photodiodes is applied across the avalanche photodiode provided in an abnormal pixel among the plurality of pixels, and capturing an image using a solid-state image sensor including a pixel array in which the plurality of sensors are provided.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Exemplary embodiments of the present invention will be described in detail in accordance with the accompanying drawings. It should be noted that the present invention is not limited to the embodiments described below and may be modified as appropriate. Additionally, the embodiments described below may be combined as appropriate.

First Embodiment

Figure 1:
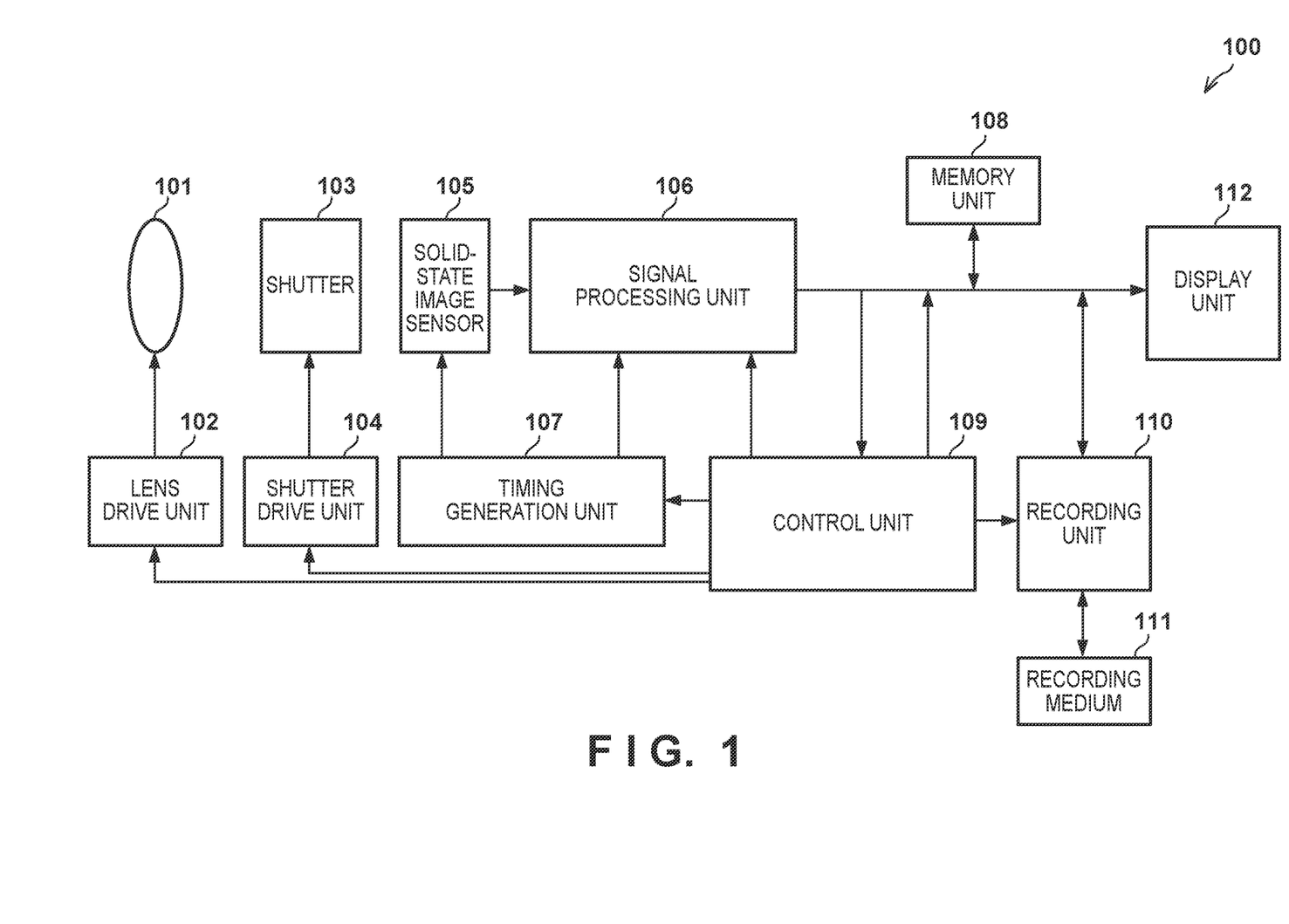
FIG. 1 is block diagram that shows an image capturing apparatus according to a first embodiment.

A solid-state image sensor, an image capturing apparatus, and an image capturing method according to a first embodiment of the present invention will be described below with reference to FIGS. 1 to 5. FIG. 1 is a block diagram that shows the image capturing apparatus according to the present embodiment.

An image capturing apparatus 100 according to the present embodiment includes a lens drive unit 102, a shutter 103, a shutter drive unit 104, a solid-state image sensor 105, a signal processing unit 106, a timing generation unit 107, a memory unit 108, a control unit 109, a recording unit 110, and a display unit 112. Additionally, the image capturing apparatus 100 includes an imaging lens (an imaging optical system, a lens unit) 101. The imaging lens 101 may or may not be detachable from the body of the image capturing apparatus 100.

The solid-state image sensor 105 generates an image signal by photoelectrically converting an optical image of a subject formed by the imaging lens 101, and outputs the generated image signal. Each unit pixel 306 provided in the solid-state image sensor 105 (see FIG. 3) includes an avalanche photodiode 302 (see FIG. 3) and a counter 305 (see FIG. 3), and may count and output the number of incident photons as a signal value.

The lens drive unit 102 drives the imaging lens 101 and performs various types of control, such as zoom control, focus control, and aperture control. The imaging lens 101 generates an optical image of an object and forms the generated optical image on the imaging plane of the solid-state image sensor 105.

The shutter 103 is interposed between the imaging lens 101 and the solid-state image sensor 105. The shutter 103 is a mechanical shutter driven by the shutter drive unit 104.

The signal processing unit 106 performs predetermined signal processing (image processing), such as correction, on the image signal (image data) output by the solid-state image sensor 105. The signal processing unit 106 may also perform signal processing such as development and compression. The signal processing unit 106 may cooperate with the control unit 109 to function as a processing unit for performing predetermined processing on the signals output from the solid-state image sensor 105.

The timing generation unit (timing generator) 107 provides the solid-state image sensor 105, the signal processing unit 106, and the like with various types of timing signals.

The control unit (overall control/arithmetic unit, control means) 109 performs overall control of the image capturing apparatus 100 and also performs predetermined computing, etc. The control unit 109 outputs control signals to drive each block of the image capturing apparatus 100 and also outputs control data, etc., to control the solid-state image sensor 105.

The memory unit 108 temporarily stores image data, etc.

The display unit 112 shows image signals that have undergone the predetermined processing, etc., under the control of the control unit 109 and various types of setting information, etc., of the image capturing apparatus 100.

The recording unit 110 records, in a recording medium 111, image signals and the like processed by the signal processing unit 106, etc. Moreover, the recording unit 110 reads out the image signals and the like recorded in the recording medium 111. The recording medium 111 may or may not be detachable from the recording unit 110. The recording medium 111 may be, for example, a semiconductor memory such as a flash memory.

The following describes the operation of the image capturing apparatus 100 during shooting.

When the main power source is turned on through a user operation made on a power source switch, the power supply to the control unit 109, etc., is turned on, and the power supply to the signal processing unit 106, etc., is also turned on.

Subsequently, when the user presses a release button (not shown), a shooting operation of the image capturing apparatus 100 is started. Once the image capturing apparatus 100 completes the shooting operation, the signal processing unit 106 performs predetermined signal processes on the image signal output from the solid-state image sensor 105. The image data (data) on which the predetermined signal processes have been performed by the signal processing unit 106 is stored in the memory unit 108 as per the instruction made by the control unit 109. The data held in the memory unit 108 is recorded in the recording medium 111 via the recording unit 110 in accordance with control by the control unit 109.

Note that image data and the like may also be output to a personal computer, etc., via an external I/F unit (not shown). The personal computer, etc., may then perform the predetermined signal processes on the image data.

Figure 2:
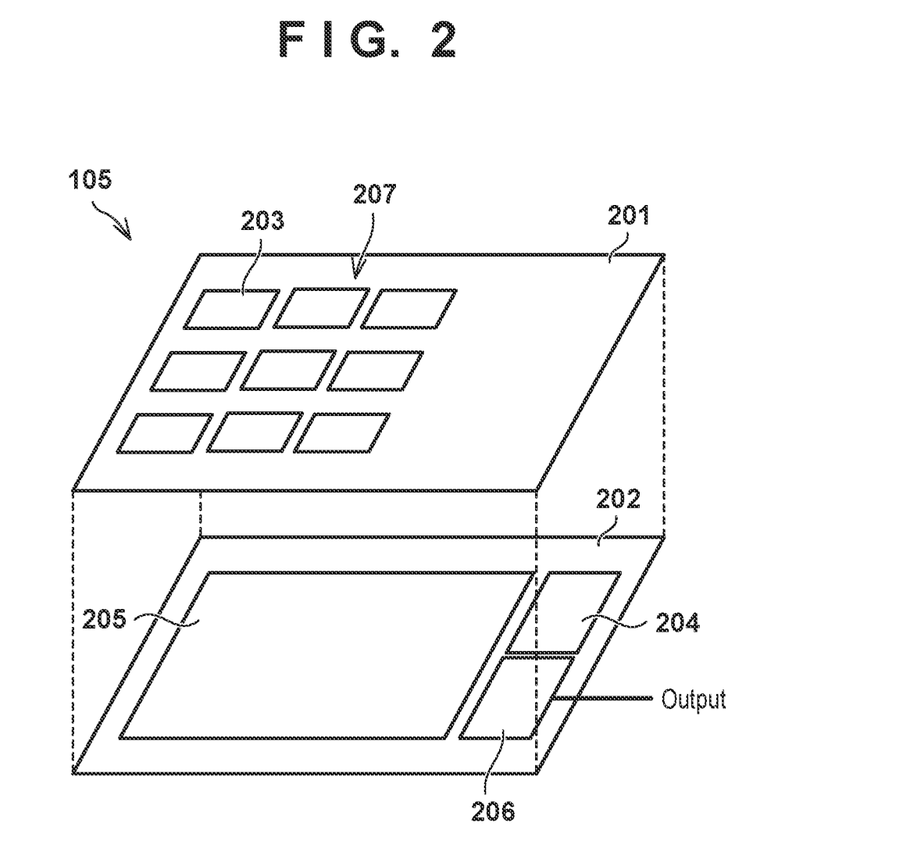
FIG. 2 shows an exemplary layout of a solid-state image sensor according to the first embodiment.

The following describes the solid-state image sensor 105 according to the present embodiment with reference to FIG. 2. FIG. 2 shows an exemplary layout of the solid-state image sensor 105 according to the present embodiment.

The solid-state image sensor 105 is constructed by stacking a sensor unit substrate 201 that includes a pixel array (pixel portion) 207 in which a plurality of sensor units 203 are arranged in a matrix, and a counting unit substrate 202 that includes a pixel control unit 205 in which a plurality of counters 305 (see FIG. 3) are arranged in a matrix. The electrodes (not shown) provided on the sensor unit substrate 201 and the electrodes (not shown) provided on the counting unit substrate 202 are electrically connected to each other. Accordingly, a pulse signal PLS output from a sensor unit 203 provided on the sensor unit substrate 201 is input to a counter 305 provided on the counting unit substrate 202. Furthermore, a control signal PDEF output from the pixel control unit 205 provided on the counting unit substrate 202 is supplied to a switch 303 (see FIG. 3) provided on the sensor unit substrate 201.

The counting unit substrate 202 includes an abnormal pixel storage unit 204, the pixel control unit 205, and a signal processing circuit 206. The abnormal pixel storage unit 204 is a memory for storing the addresses of the pixels that have a defect, i.e., abnormal pixels, among the plurality of unit pixels 306. The pixel control unit 205 includes a plurality of counters 305 that respectively correspond to the plurality of the sensor units 203. The counters 305 count the number of signal pulses output from the respective sensor units 203 in response to photons being incident on the sensor units. The count values counted at the pixel control unit 205 are output to the outside via the signal processing circuit 206. The pixel control unit 205 appropriately controls each pixel based on the abnormal pixel information stored in the abnormal pixel storage unit 204. The pixel control unit 205 functions as a setting unit as described below. The setting unit performs setting so that a voltage greater than or equal to a breakdown voltage is applied across the avalanche photodiode 302 provided in each abnormal pixel and a voltage lower than the breakdown voltage is applied across the avalanche photodiode 302 provided in each pixel that is not abnormal.

As the sensor units 203 and the counters 305 are provided on separate substrates, a larger area can be secured for the pixel array 207. Note that the configuration of the solid-state image sensor 105 is not limited to the configuration described above. For example, the same substrate may be provided with the sensor units 203 and the counters 305.

Figure 3:
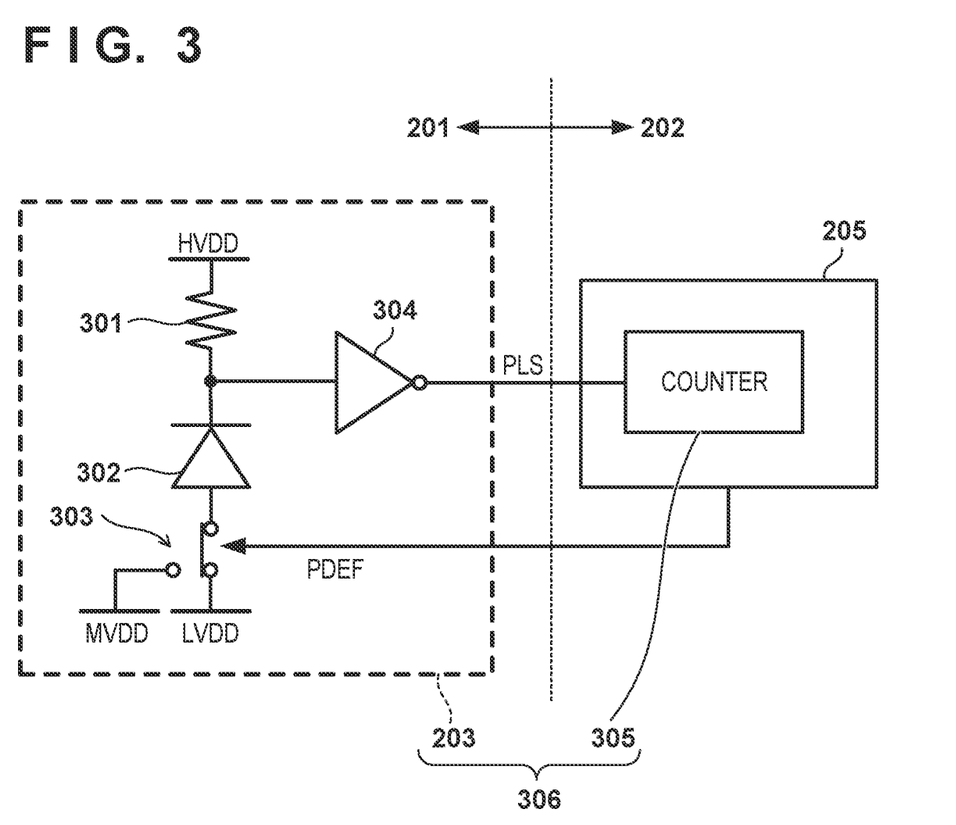
FIG. 3 is a diagram that shows a unit pixel provided in the solid-state image sensor according to the first embodiment.

The following describes the unit pixels 306 provided in the solid-state image sensor 105 with reference to FIG. 3. FIG. 3 is a diagram that shows a unit pixel 306 provided in the solid-state image sensor 105.

As shown in FIG. 3, the unit pixel 306 includes a sensor unit (photoreceptor unit) 203 and a counter 305. The sensor unit 203 is provided with an avalanche photodiode 302, a quenching resistor 301, a switch 303, and an inverting buffer 304. The anode of the avalanche photodiode 302 is connected to a first potential LVDD or a second potential MVDD via the switch 303 while the cathode of the avalanche photodiode 302 is connected to one end of the quenching resistor 301. The other end of the quenching resistor 301 is connected to a third potential HVDD.

When the anode of the avalanche photodiode 302 is connected to the first potential LVDD via the switch 303, a reverse bias voltage greater than or equal to the breakdown voltage is applied across the avalanche photodiode 302 via the quenching resistor 301. In this case, the avalanche photodiode 302 operates in a Geiger mode. That is, a photon incident on the avalanche photodiode 302 triggers an avalanche multiplication phenomenon. Thus, an avalanche current is generated and a voltage drop occurs across the quenching resistor 301. The quenching resistor 301 is a resistance element for stopping the avalanche multiplication phenomenon of the avalanche photodiode 302. The quenching resistor 301 may be configured using the resistance component of a transistor. When an avalanche current is generated due to an avalanche multiplication phenomenon occurring in the avalanche photodiode 302, a voltage drop occurs across the quenching resistor 301, and a drop in the reverse bias voltage applied across the avalanche photodiode 302 occurs. The avalanche multiplication phenomenon stops when the reverse bias voltage drops to the breakdown voltage. As a result, the avalanche current ceases to flow, and a reverse bias voltage greater than or equal to the breakdown voltage of the avalanche photodiode 302 is again applied across the avalanche photodiode 302.

The inverting buffer 304 is provided to extract the change in voltage that occurs in the quenching resistor 301, as a pulse signal PLS. When a photon is incident on the avalanche photodiode 302, the inverting buffer 304 outputs a pulse signal PLS. In this way, the sensor unit 203 generates pulses at a frequency according to the frequency at which photons are received.

When the anode of the avalanche photodiode 302 is connected to the second potential MVDD via the switch 303, a reverse bias voltage smaller than the breakdown voltage is applied across the avalanche photodiode 302 via the quenching resistor 301. In this case, the avalanche photodiode 302 does not operate in the Geiger mode.

When the control signal PDEF supplied to the switch 303 from the pixel control unit 205 is at an L-level, the anode of the avalanche photodiode 302 is connected to the ground potential LDVV. On the other hand, when the control signal PDEF supplied to the switch 303 from the pixel control unit 205 is at an H-level, the anode of the avalanche photodiode 302 is connected to the second potential MDVV.

Figure 4:
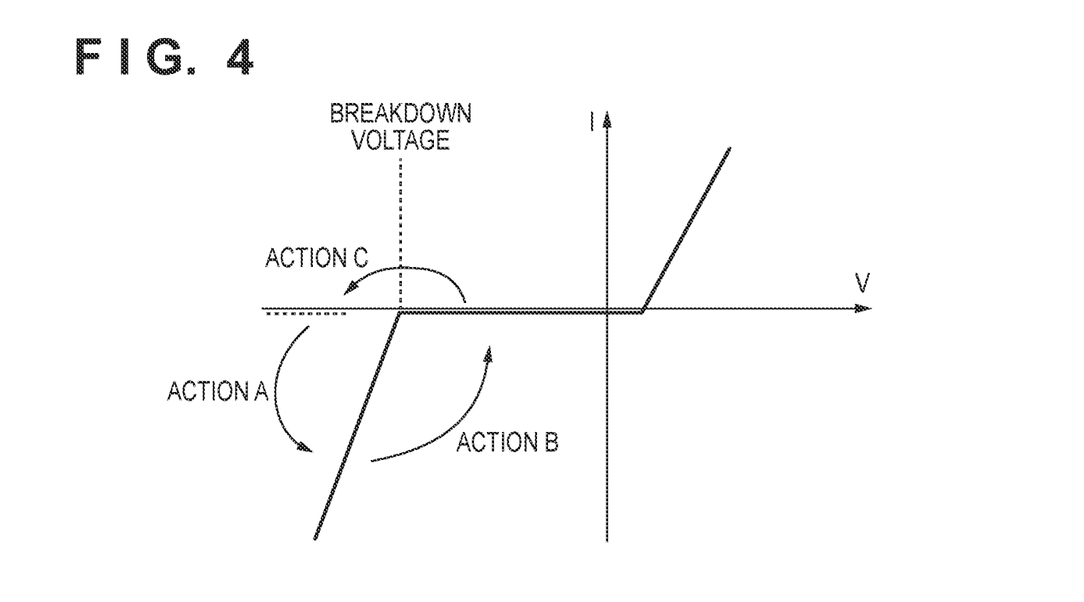
FIG. 4 is a graph that shows voltage-current characteristics of an avalanche photodiode.

Next, the operation of the sensor unit 203 when the control signal PDEF at the L-level is supplied will be described with reference to FIG. 4. FIG. 4 is a graph that shows the voltage-current characteristics of the avalanche photodiode.

The control signal PDEF at the L-level is supplied to the sensor unit 203 of a unit pixel 306 that does not have any defect, or a normal pixel, from the pixel control unit 205. When the control signal PDEF is at the L-level, the anode of the avalanche photodiode 302 is connected to the first potential LVDD via the switch 303. As a result, the avalanche photodiode 302 operates in the Geiger mode. When a photon is incident on the avalanche photodiode 302, an avalanche multiplication phenomenon occurs in the avalanche photodiode 302, and a large current flows through the avalanche photodiode 302 (action A). When a large current flows through the avalanche photodiode 302, a voltage drop occurs across the quenching resistor 301, the reverse bias voltage applied across the avalanche photodiode 302 falls below the breakdown voltage, and the avalanche multiplication phenomenon (action B) is stopped. When the avalanche multiplication phenomenon is stopped, a reverse bias voltage greater than or equal to the breakdown voltage of the avalanche photodiode 302 is applied across the avalanche photodiode 302 again, returning the operating mode of the avalanche photodiode 302 to the Geiger mode (action C).

The potential at the input terminal of the inverting buffer 304 changes as a result of the action A to C described above. The inverting buffer 304 performs wave shaping and outputs a pulse signal PLS. The pulse signal PLS output from the inverting buffer 304 is counted by the counter 305. By repeating such action, the number of photons incident on the avalanche photodiode 302 is counted.

Note that, if an abnormal pixel is caused to operate in the above-described manner, an avalanche multiplication phenomenon is also generated not only by an incident photon but also by a dark electron generated due to the defect. In a pixel with a serious defect, dark electrons are constantly generated and thus an avalanche multiplication phenomenon occurs at a high frequency, resulting in a large amount of power being consumed.

Next, the operations of the sensor unit 203 when the control signal PDEF at the H-level is supplied will be described. In the present embodiment, the control signal PDEF at the H-level is supplied to the sensor unit 203 of a unit pixel 306 that has a defect, that is, an abnormal pixel, from the pixel control unit 205. When the control signal PDEF is at the H-level, the anode of the avalanche photodiode 302 is connected to the second potential MVDD via the switch 303. Thus, the reverse bias voltage applied across the avalanche photodiode 302 is smaller than the breakdown voltage of the avalanche photodiode 302, and the avalanche photodiode 302 operates in a linear mode. In this case, even if a photon is incident on the particular unit pixel 306 and if a dark electron is generated in the unit pixel 306, an avalanche multiplication phenomenon does not occur, thus suppressing power consumption. Furthermore, no potential change occurs in the input terminal of the inverting buffer 304, and thus the counter 305 does not perform a count operation and count value of the counter 305 remains as "0".

Figure 5:
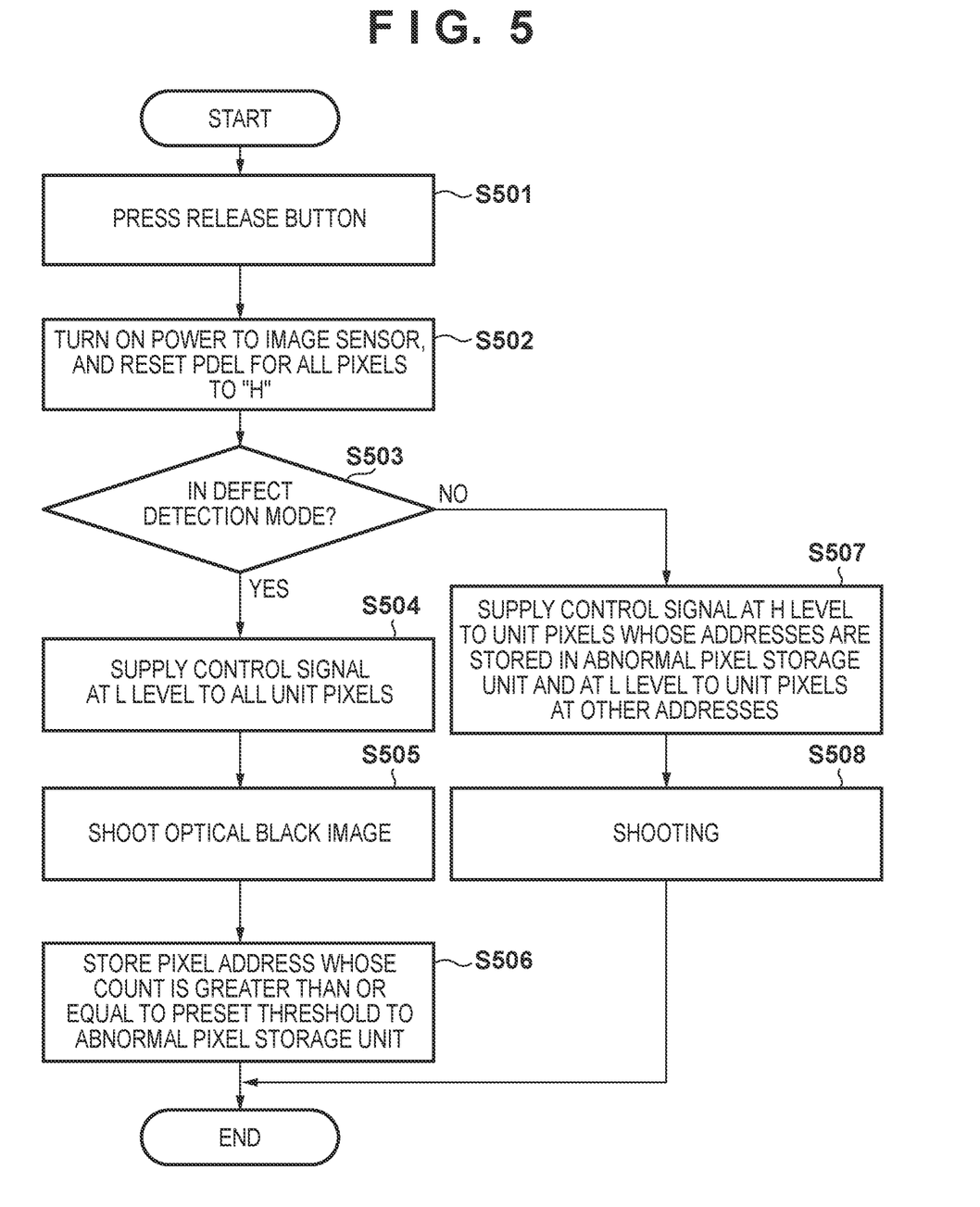
FIG. 5 shows a flowchart that shows operations of the solid-state image sensor according to the first embodiment.

The following describes the operations of solid-state image sensor 105 according to the present embodiment with reference to FIG. 5. FIG. 5 shows a flowchart that shows the operations of the solid-state image sensor 105 according to the present embodiment. FIG. 5 shows the operations in a defect detection mode and in a shooting mode. The defect detection mode refers to a mode for detecting an abnormal pixel and storing the address of the detected abnormal pixel in the abnormal pixel storage unit 204. The shooting mode refers to a mode in which an image of a subject is actually captured.

First, in step S501, when the release button (not shown) is pressed, an instruction for performing a shooting operation made by the user is detected, and the process of the flowchart starts. Subsequently, the process proceeds to step S502.

In step S502, the solid-state image sensor 105 is turned on. At this time, the logical initial value of the control signal PDEF output by the pixel control unit 205 is set to "H" for all the addresses. With this configuration, power is not consumed by abnormal pixels when power is turned on. Then, the process proceeds to step S503. Note that, although power is turned on when the user issues an instruction to capture an image according to the present embodiment, the invention is not limited to this. For example, power may be turned on at predetermined time intervals. Alternatively, when power is turned on, all of the pixels may operate in the linear mode before an instruction to capture an image is issued, and the operation mode of normal pixels may be changed to the Geiger mode in response to an instruction to capture an image.

In step S503, whether or not the solid-state image sensor 105 operates in the defect detection mode or in the shooting mode is determined. For example, before shipment of the solid-state image sensor 105 or the image capturing apparatus 100, if the solid-state image sensor 105 operates in the defect detection mode, the addresses of the abnormal pixels are stored in the abnormal pixel storage unit 204. Additionally, the solid-state image sensor 105 can operate in the defect detection mode even if the user makes an operation via an operation unit (not shown) to cause the solid-state image sensor 105 to operate in the defect detection mode. In addition, immediately before acquiring a real image, which is before shooting is started, the solid-state image sensor 105 may be operated in the defect detection mode to acquire an optical black image. If the solid-state image sensor 105 operates in the defect detection mode (YES in step S503), the process proceeds to step S504. Meanwhile, if the solid-state image sensor 105 does not operate in the defect detection mode (NO in step S503), that is, if the solid-state image sensor 105 operates in the shooting mode, the process proceeds to step S507.

In step S504, the pixel control unit 205 sets the control signals PEDF supplied to all of the unit pixels 306 to the L-level. In this way, the avalanche photodiodes 302 of all the unit pixels 306 are to operate in the Geiger mode. Then, the process proceeds to step S505.

In step S505, the shooting operation is performed with the shutter 103 closed to acquire an optical black image. In a normal unit pixel 306, hardly any photons are incident on the unit pixel 306, and thus the count value in the unit pixel 306 is close to zero. On the other hand, dark electrons occur in an abnormal pixel, and thus the count value in the unit pixel 306 is larger. The pixel control unit 205 determines a unit pixel 306 whose count value is greater than or equal to a predetermined threshold value to be an abnormal pixel. Then, the process proceeds to step S506.

In step S506, the pixel control unit 205 stores, in the abnormal pixel storage unit 204, information that indicates the address of the unit pixel 306 determined to be an abnormal pixel, i.e., abnormal pixel information. Subsequently, the operation in the defect detection mode is terminated.

In step S507, the pixel control unit 205 supplies a control signal PDEF in the H-level to the switches 303 of the unit pixels 306 that correspond to the addresses stored in the abnormal pixel storage unit 204, and a control signal PDEF in the L-level to the switches 303 of the unit pixels 306 that correspond to other addresses. Accordingly, the abnormal pixels operate in the linear mode, an avalanche multiplication phenomenon does not occur, and power consumption can be suppressed. Then, the process proceeds to step S508.

In step S508, normal shooting is performed. This terminates the operation in the shooting mode.

Note that in the present invention, a case in which only the addresses of abnormal pixels are stored in the abnormal pixel storage unit 204 was explained as an example. However, the present invention is not limited to this. Information that indicates the degree of defectiveness of these abnormal pixels may also be stored in the abnormal pixel storage unit 204 together with the addresses of the abnormal pixels. Additionally, the control signal PDEF may be switched according to the ambient temperature, the storage time, the sensitivity, and the like of the solid-state image sensor 105.

In this way, according to the present embodiment, if a unit pixel 306 is an abnormal pixel, the reverse bias voltage applied across the avalanche photodiode 302 of that unit pixel 306 is set to be smaller than the breakdown voltage of the avalanche photodiode 302. In this way, according to the present embodiment, it is possible to prevent an avalanche multiplication phenomenon caused by a dark electron generated by a defect, and a reduction of power consumption can be realized.

Second Embodiment

Figure 6:
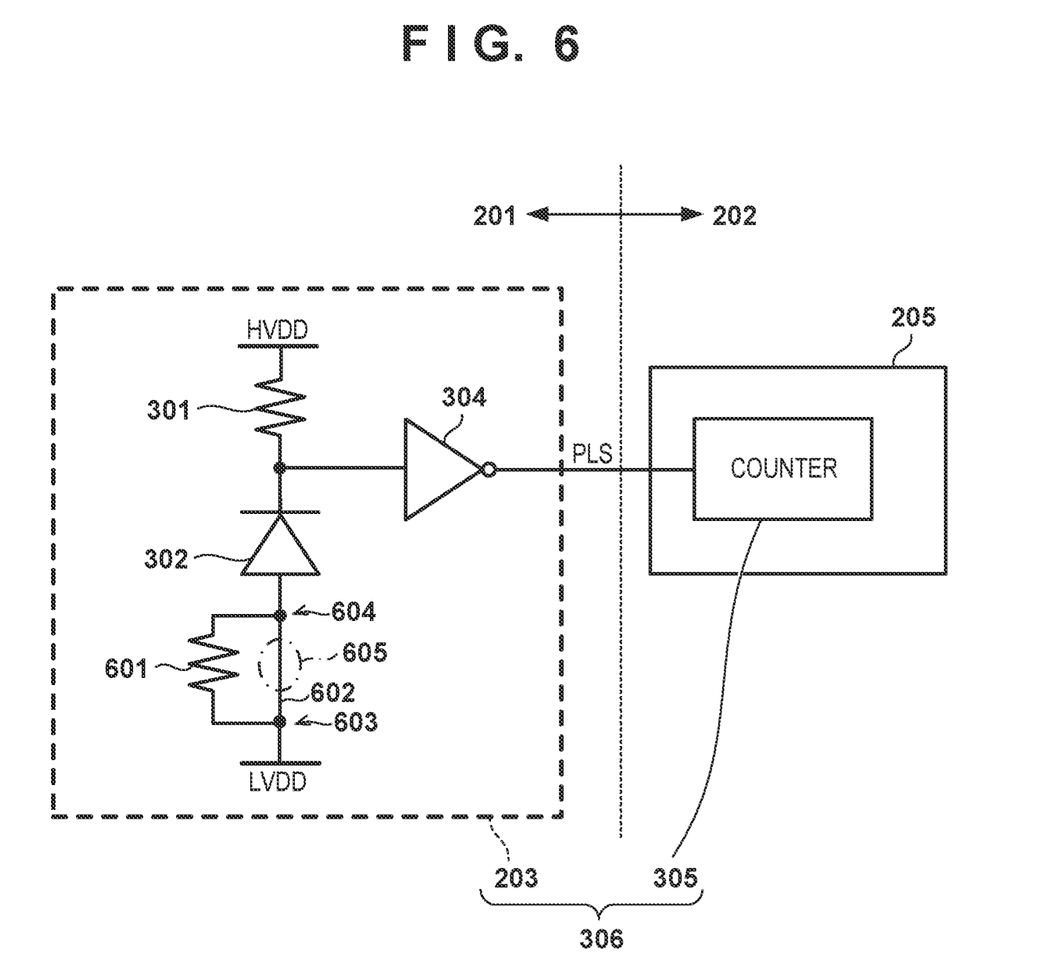
FIG. 6 is a diagram that shows a unit pixel provided in a solid-state image sensor according to a second embodiment.

A solid-state image sensor, an image capturing apparatus, and a method of capturing an image according to a second embodiment of the present invention will be described below with reference to FIG. 6. FIG. 6 is a diagram that shows a unit pixel provided in the solid-state image sensor according to the present embodiment. In the solid-state image sensor according to the present embodiment, wiring 602 of the abnormal pixels is cut (fusion cutting) through laser irradiation or the like.

As shown in FIG. 6, in the solid-state image sensor according to the present embodiment, the anode of the avalanche photodiode 302 is connected to the first potential LVDD via the wiring 602. One end of a resistor 601 is connected to a point 603 in the wiring 602. The other end of the resistor 601 is connected to another point 604 in the wiring 602.

When the wiring 602 is not cut, both ends of the resistor 601 are short-circuited by the wiring 602. The anode of the avalanche photodiode 302 is at the first potential LVDD, and thus the avalanche photodiode 302 operates in the Geiger mode.

By cutting the wiring 602 in the section 605, which is elliptically circled by a dashed-dotted line, through laser irradiation or the like, the anode of the avalanche photodiode 302 is connected to the first potential LVDD via the resistor 601. The value of resistance of the resistor 601 is set to cause a reverse bias voltage smaller than the breakdown voltage of the avalanche photodiode 302 to be applied between the anode and the cathode of the avalanche photodiode 302. In this way, if the wiring 602 is cut, an avalanche multiplication phenomenon is unlikely to occur in the avalanche photodiode 302, and the avalanche photodiode 302 operates in the linear mode.

In a factory where solid-state image sensors are manufactured, a test is performed on manufactured solid-state image sensors. In the test, an optical black image is acquired so as to determine which of the sensor pixels are abnormal based on the acquired optical black image. The wiring 602 of those abnormal pixels is cut, for example, by laser.

The resistor 601 and the wiring 602 function as a setting unit as described below. The setting unit performs setting so that a reverse voltage smaller than the breakdown voltage is applied across the avalanche photodiode 302 provided in each abnormal pixel and a reverse voltage greater than or equal to the breakdown voltage is applied across the avalanche photodiode 302 provided in each pixel that is not abnormal.

As described above, according to the present embodiment, an abnormal pixel is processed to prevent the abnormal pixel from operating in the Geiger mode. The switch 303 provided in the first embodiment is not required according to the present embodiment. Moreover, no wiring is required to supply the control signal PDEF. Moreover, no wiring is required to supply the second potential MDVV. Furthermore, no abnormal pixel storage unit 204 is required. As none of these components are required, the present embodiment can contribute to an enlarged area of the avalanche photodiode 302 and a reduced cost.

Third Embodiment

In the first embodiment, a configuration is described that includes a switch that switches between the connection of the anode of the avalanche photodiode 302 to the voltage LVDD and connection of that anode to the voltage MVDD.

Figure 7:
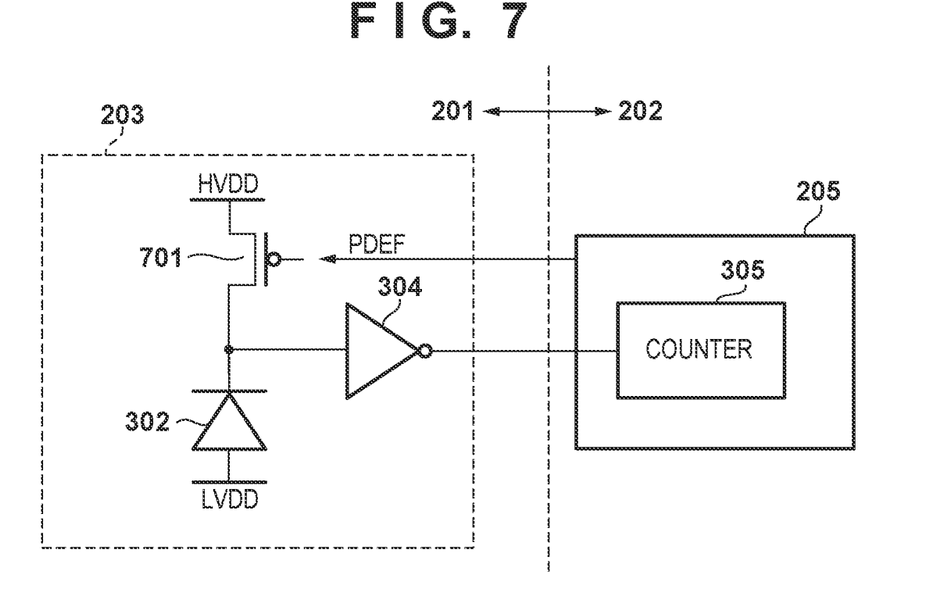
FIG. 7 is a diagram that shows a unit pixel provided in a solid-state image sensor according to a third embodiment.

In the present embodiment, an alternative configuration is shown in which the quenching resistor 301, which is provided on the cathode side of the avalanche photodiode 302, is replaced with a MOS transistor.

The configuration of a unit pixel 306 according to the third embodiment will be described hereinafter with reference to FIG. 7. Compared with the configuration shown in FIG. 3, the voltage MVDD and the voltage changeover switch 303 are not required, and the quenching resistor 301 is replaced with a PMOS transistor 701 so that the control signal PDEF is input to the gate of the PMOS transistor 701.

In the case of a normal pixel, an avalanche multiplication phenomenon is controlled by setting the control signal PDEF to "L", bringing the PMOS transistor into an on state, and causing the on resistance of the PMOS transistor to function as a quenching resistance. On the other hand, in the case of an abnormal pixel, control is performed to prevent the occurrence of an avalanche multiplication phenomenon by setting the control signal PDEF to "H" and turning off the PMOS transistor to float the cathode of the avalanche photodiode 302.

This configuration can also reduce the amount of power consumed by abnormal pixels as in the first embodiment.

Note that, although a PMOS transistor 701 is used in place of the quenching resistor 301 in the foregoing description, an NMOS transistor may alternatively be used by setting the control signal PDEF to "H" for a normal pixel and the control signal PDEF to "L" for an abnormal pixel.

Fourth Embodiment

In view of the problem of increased power consumption due to abnormal pixels, the first to third embodiments describe exemplary cases in which an avalanche multiplication phenomenon due to dark electrons is prevented by performing control to keep the reverse bias voltage applied across the avalanche photodiode of an abnormal pixel smaller than the breakdown voltage. The above-described technology prevents an avalanche multiplication phenomenon from occurring in the abnormal pixel, and thus the counter is constantly "0". As this will be visually recognized as a black blemish, correction needs to be performed. Note that it is not possible for the signal processing unit 106 to determine, based on the counter value, whether the counter value is "0" because this is an abnormal pixel or because this is a normal pixel with an output value of "0". Moreover, one possible approach is to determine whether pixels are abnormal by creating data regarding the addresses of the abnormal pixels and storing these addresses in the memory unit 108 in a subsequent stage during an inspection at an image sensor factory. However, this is not desirable as it takes up a large portion of the capacity of the memory unit 108.

The following describes a configuration that allows for accurate determination as to whether a given pixel is abnormal so as not to reduce the capacity of the memory unit 108.

Figure 8:
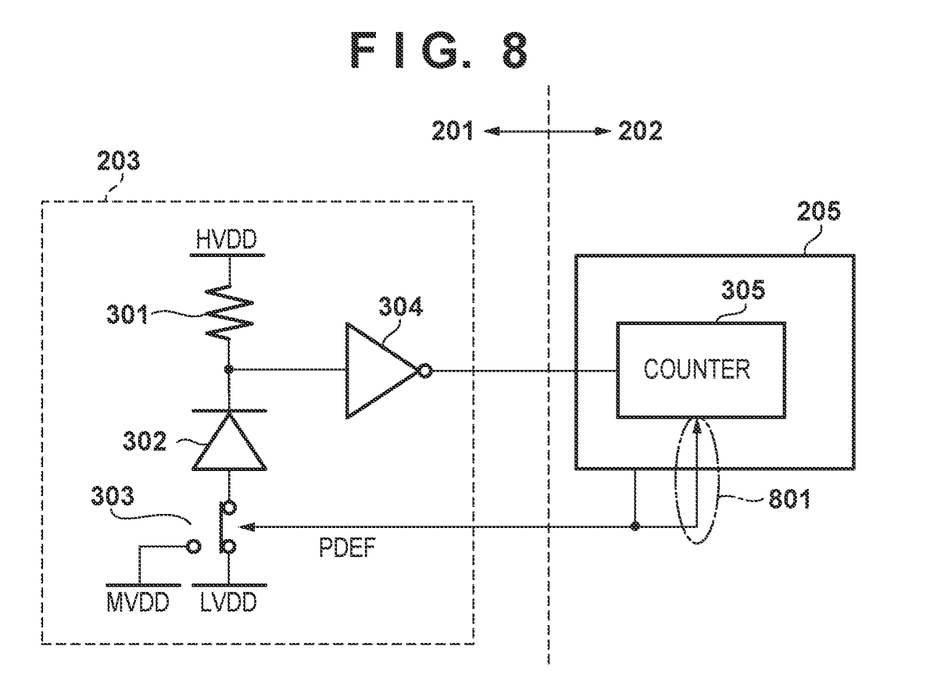
FIG. 8 is a diagram that shows a unit pixel provided in a solid-state image sensor according to a fourth embodiment.

The configuration of a unit pixel 306 according to a fourth embodiment will be described hereinafter with reference to FIG. 8. Compared with the configuration shown in FIG. 3, the control signal PDEF output by the pixel control unit 205 is also input to the counter 305 as shown in a dashed-dotted line 801.

The following describes the operations of the counter 305 according to the fourth embodiment.

The counter 305 is reset immediately before the start of exposure. At this moment, if the control signal PDEF input into the counter 305 is at the H-level, i.e., if the pixel is abnormal, the reset value of the counter 305 is set to "0". If the control signal PDEF is at the L-level, i.e., if the pixel is normal, the reset value of the counter 305 is set to "1".

With this configuration, as the count value of a normal pixel is at least one without exception, it is possible to determine that a pixel is abnormal if its count value is "0" and that a pixel is normal if its counter value is "1" or more. The signal processing unit 106 in a subsequent stage determines that a pixel whose count value is "0" is an abnormal pixel and performs various corrections on the abnormal pixel. Note that the value "1" which is the reset value for a normal pixel may be subtracted in the subsequent defect corrections performed by the signal processing unit 106, to eliminate its effect.

Thus, abnormal pixels can be accurately distinguished from normal pixels in the processing circuit in a subsequent stage without taking up a large portion of the capacity of the memory unit 108.

Note that an example in which the counter reset value for a normal pixel is "1" and the counter reset value for an abnormal pixel is "0" is described above, the present invention is not limited to this. If the counter reset value for an abnormal pixel is "0", the counter reset value for a normal pixel may be any predetermined value other than "0".

Other Embodiments

Having described preferred embodiments of the present invention as above, the present invention is not limited to these embodiments but may be modified and changed in various manners without departing from the spirit of the invention.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2017-244141, filed on Dec. 20, 2017, and No. 2018-176149, filed on Sep. 20, 2018, which are hereby incorporated by reference herein in their entirety.

What is claimed is:

1. A solid-state image sensor comprising one or more processors and/or circuitry which functions as:
a pixel portion in which a plurality of pixels are arranged, each pixel being provided with a sensor that includes an avalanche photodiode, a quenching resistor, and a structure of selecting a bias voltage to be applied,
wherein for a defective pixel among the plurality of pixels, the structure is set to select a bias voltage smaller than a breakdown voltage of the avalanche photodiodes, to be applied across the respective avalanche photodiode.

2. The solid-state image sensor according to claim 1, wherein for a non-defective pixel among the plurality of pixels, the structure is set to select a bias voltage greater than or equal to the breakdown voltage of the avalanche photodiodes, to be applied across the respective avalanche photodiode.

3. The solid-state image sensor according to claim 1, wherein for each of the pixels:
the structure is a switch,
when an anode of the avalanche photodiode is connected to a first potential via the switch, a bias voltage greater than or equal to the breakdown voltage of the avalanche photodiodes is applied across the avalanche photodiode, and
when the anode of the avalanche photodiode is connected to a second potential different from the first potential via the switch, a bias voltage smaller than the breakdown voltage of the avalanche photodiodes is applied across the avalanche photodiode.

4. The solid-state image sensor according to claim 3, further comprising one or more processors and/or circuitry which functions as a storage that stores information that indicates the defective pixel,
wherein the switch of each pixel connects to either the first potential or the second potential based on the information that indicates the defective pixel stored in the storage.

5. The solid-state image sensor according to claim 2, wherein for each of the pixels:
the structure is wiring with one end connected to the anode of an avalanche photodiode and the other end connected to a predetermined potential, and a resistor with one end connected to a point in the wiring and the other end connected to another point in the wiring,
the wiring is not cut if the pixel is a non-defective pixel, and
the wiring is cut between the point and the other point if the pixel is a defective pixel.

6. The solid-state image sensor according to claim 2, wherein the quenching resistors and the structure in each pixel portion are integrally realized by the on resistance of an MOS transistor, and
a bias voltage greater than or equal to the breakdown voltage of the avalanche photodiodes is applied by turning on the MOS transistors of the non-defective pixels among the plurality of pixels, and a bias voltage smaller than the breakdown voltage of the avalanche photodiodes is applied by turning off the MOS transistors of the defective pixel among the plurality of pixels.

7. The solid-state image sensor according to claim 6, further comprising one or more processors and/or circuitry which functions as a storage that stores information that indicates the defective pixel,
wherein the MOS transistors are turned on or off based on the information that indicates the defective pixel stored in the storage.

8. The solid-state image sensor according to claim 1, further comprising one or more processors and/or circuitry which functions as counters that counts signals output by the respective sensors.

9. The solid-state image sensor according to claim 8, wherein the controller sets a reset value of the counter that corresponds to the defective pixel among the plurality of pixels to "0".

10. The solid-state image sensor according to claim 9, further comprising one or more processors and/or circuitry which functions as a storage that stores information that indicates the defective pixel and a controller,
wherein the controller controls the reset values of the counters based on the information that indicates the defective pixel stored in the storage.

11. The solid-state image sensor according to claim 8, wherein the sensors are provided on a first substrate, and the counters for counting signals output by the respective sensors are provided on a second substrate different from the first substrate.

12. An image capturing apparatus comprising the solid-state image sensor that comprises one or more processors and/or circuitry which functions as:
a pixel portion in which a plurality of pixels are arranged, each pixel being provided with a sensor that includes an avalanche photodiode, a quenching resistor, and a structure of selecting a bias voltage to be applied,
wherein for a defective pixel among the plurality of pixels, the structure is set to select a bias voltage smaller than a breakdown voltage of the avalanche photodiodes, to be applied across the respective avalanche photodiode, and
a processor that performs predetermined signal processes on signals output by the solid-state image sensor.

13. A method of capturing an image, comprising:
setting so that, in a plurality of pixels each provided with a sensor that includes an avalanche photodiode, a quenching resistor, and a structure of selecting a bias voltage to be applied, for a defective pixel among the plurality of pixels, the structure selects a bias voltage smaller than a breakdown voltage of the avalanche photodiodes, to be applied across the respective avalanche photodiode, and
capturing an image using a solid-state image sensor including a pixel array in which the plurality of sensors are provided.

14. The method of capturing an image according to claim 13, wherein in the setting, for a non-defective pixel among the plurality of pixels, the structure selects a bias voltage greater than or equal to the breakdown voltage of the avalanche photodiodes, to be applied across the respective avalanche photodiode.

15. The method of capturing an image according to claim 13, further comprising acquiring information that indicates the defective pixel based on an optical black image acquired using the solid-state image sensor.

16. The method of capturing an image according to claim 14, wherein the solid-state image sensor further includes counters that count signals output by the respective sensors, and the method further comprises setting a reset value of the counters that correspond to the non-defective pixels among the plurality of pixels to a predetermined value other than "0", and a reset value of the counter that correspond to the defective pixel among the plurality of pixels to "0".

* * * * *